United States Patent [19]
Close

[11] 3,714,580
[45] Jan. 30, 1973

[54] ELECTRONIC SEARCH TUNING SYSTEM

[75] Inventor: Ernest Frederick Close, Fort Wayne, Ind.

[73] Assignee: The Magnavox Company, Ft. Wayne, Ind.

[22] Filed: Jan. 7, 1971

[21] Appl. No.: 104,691

[52] U.S. Cl. ....................................325/470, 334/16
[51] Int. Cl. ................................................H04b 1/34
[58] Field of Search......325/335, 373, 418, 420, 422, 325/453, 468, 469, 470; 334/11, 14, 15, 16

[56] References Cited

UNITED STATES PATENTS

| | | | |
|---|---|---|---|
| 3,611,152 | 10/1971 | Sakai et al. | 325/422 |
| 3,575,662 | 4/1971 | Davisson | 325/470 |
| 3,575,661 | 4/1971 | Slavik | 325/468 |
| 3,447,087 | 5/1969 | Takezaki et al. | 325/453 |
| 2,977,467 | 3/1961 | Black | 334/11 |

*Primary Examiner*—Richard Murray
*Attorney*—Richard T. Seeger

[57] ABSTRACT

An electronic tuning system for a heterodyne type receiving device is disclosed wherein the receiving device consists of a voltage tuned radio frequency amplifier, a voltage tuned local oscillator, a first control circuit having an output which varies as a function of the magnitude of a received signal, and a second control circuit having an output which varies as a function of the frequency of an intermediate frequency signal within the receiver. Electronic search tuning is achieved by providing a first voltage source having an output which varies as a substantially linear function of time, and supplying this output to both the radio frequency amplifier and the local oscillator during the tuning process and switching from the first voltage source to the second control circuit upon finding a sufficiently strong incoming signal.

13 Claims, 3 Drawing Figures

INVENTOR
ERNEST FREDERICK CLOSE
BY Jeffers and Rickert
ATTORNEYS

INVENTOR
ERNEST FREDERICK CLOSE
BY Jeffers and Rickert
ATTORNEYS

INVENTOR
ERNEST FREDERICK CLOSE
BY Jeffers and Rickert
ATTORNEYS

ELECTRONIC SEARCH TUNING SYSTEM

CROSS REFERENCE TO RELATED APPLICATIONS

The present invention may advantageously utilize the multiple frequency FM detector disclosed in applicant's copending application entitled "MULTIPLE FREQUENCY FM DETECTOR" filed Jan. 7, 1971 Ser. No. 104,686 and assigned to the assignee of the present invention. This multiple frequency FM detector provides a signal analogous to the automatic frequency control signal present in an FM receiver for AM operation also, and is useful in effecting the search tuning scheme of the present invention during AM operation.

BACKGROUND OF THE INVENTION

The present invention relates to an all-electronic system for tuning a heterodyne type receiving device, for example, an AM or FM radio by employing voltage variable capacitor diodes commonly called "varicaps" in the RF amplifier stage as well as the local oscillator. All-electronic tuning schemes are not new and the present state of the art is well represented by the patent to Aoyama U.S. Pat. No. 3,467,870 which supplies a changing voltage to one or more varicaps until a station is encountered and then substitutes for that changing voltage a fixed voltage across a capacitor. In the Aoyama patent the capacitor 14 is intended to function as a memory capacitor which serves to maintain the receiver at its fixed stopping point due to the constant voltage maintained across the memory capacitor. This and similar schemes employing a memory capacitor fall short of the desired goal because leakage, temperature drift, and any other effect which tends to cause the voltage across the memory capacitor to change slightly with time will also cause the receiver to drift off of its selected station. Several attempts have been made to overcome this drift problem involving the use of insulated gate field effect transistors, special low leakage memory capacitors, potted circuitry to exclude dirt and moisture, and schemes to compensate for the leakage than cannot be eliminated. None of these schemes result in true inherent stability.

One scheme which does overcome the leakage problem is represented by the patent to Bento et al. U.S. Pat. No. 3,189,829. The Bento et al. patent, as will appear subsequently, is unnecessarily complex and expensive to put in operation.

SUMMARY OF THE INVENTION

The present invention discloses a system which insures the stability of tuning by frequency locking onto the selected station. A sawtooth sweep searching circuit characterized by linearity and simplicity provides a linearly increasing search voltage which is interrupted and replaced by an automatic frequency control signal when a station is encountered. A significant improvement of the present invention over the prior art as represented by the Aoyama patent is that the required tuning voltage is maintained by the control action of the automatic frequency control circuit rather than the simple charged capacitor memory. If any variations occur during operation, the automatic frequency control loop will hold the receiver to its selected station. Manual tuning may be easily implemented in the present invention by providing a simple multiposition switch which introduces a false automatic frequency control signal causing the receiver to tune up or down at a rate dependent upon the amount of false AFC signal introduced.

Accordingly, it is one object of the present invention to provide an all electronic search tuning system.

It is a further object of the present invention to provide a search tuning system which is inherently stable once it selects an incoming signal.

It is another object of the present invention to provide an all electronic search tuning system which is readily adaptable to optional manual tuning.

A still further object of the present invention is to provide a materially simplified automatic tuning system.

It is yet another object of the present invention to provide a search tuning system adaptable to virtually all types of receiving devices.

These and other objects and advantages of the present invention will appear more clearly from the following detailed disclosure read in conjunction with the accompanying drawings.

DESCRIPTION OF THE PREFERRED EMBODIMENT

Figure 1:
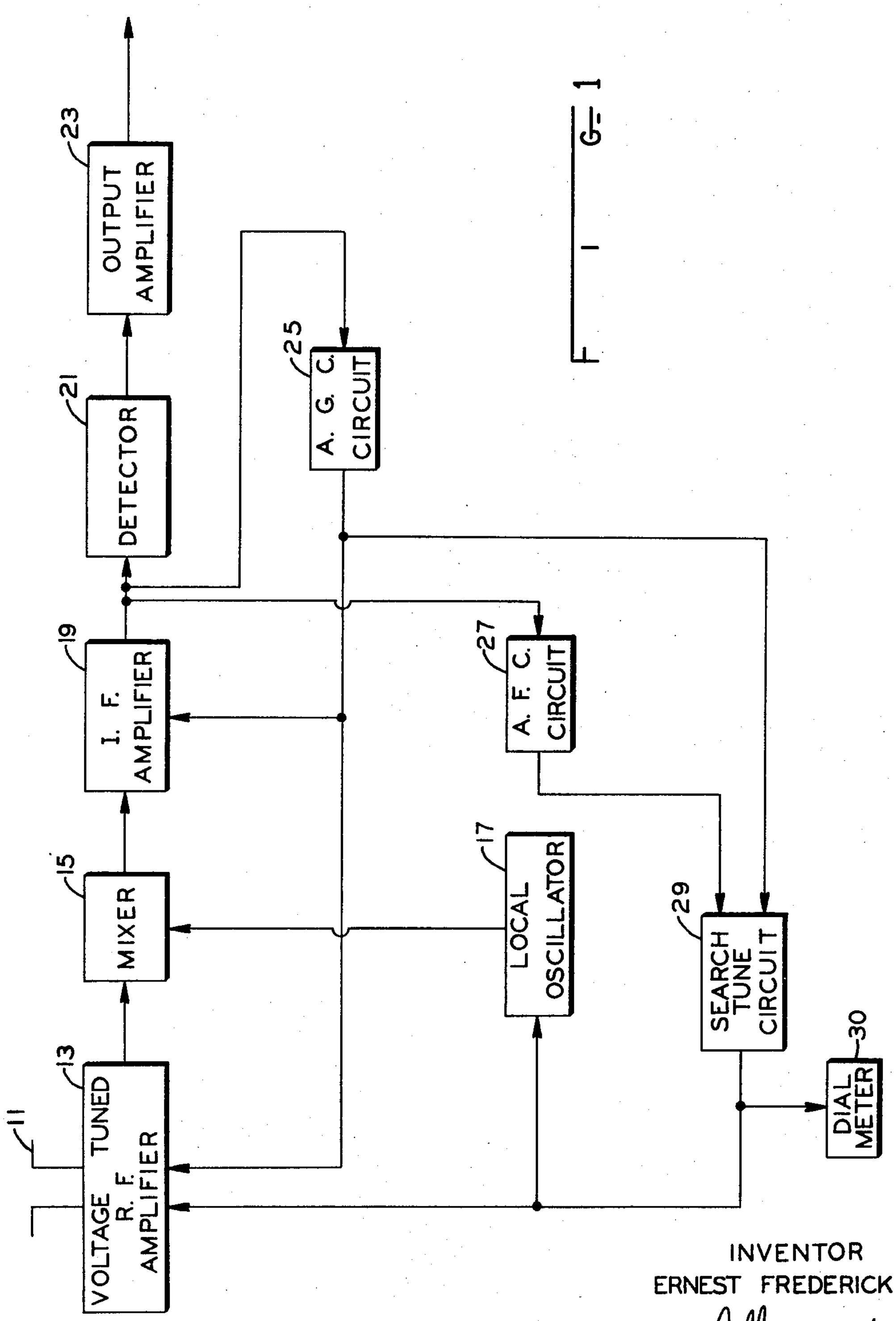
FIG. 1 is a block diagram of a somewhat generalized heterodyne receiving device employing the present invention.

Turning first to the somewhat generalized block diagram of a heterodyne type receiving device shown in FIG. 1, a radio frequency signal is picked up by the antenna 11 and supplied to a voltage tuned radio frequency amplifier 13. As mentioned earlier, the voltage tuned feature of the RF amplifier 13 may be achieved by providing a voltage variable capacitor diode or "varicap" in a well known RF tank circuit. The thus selected and amplified radio frequency signal is supplied to a mixer 15 which, according to well known techniques, mixes the amplified incoming signal with a locally generated signal from the local oscillator 17 to provide an intermediate frequency signal output to the IF amplifier 19. After one or more stages of intermediate frequency amplification the IF signal is supplied to a detector 21 appropriate to the particular type of modulation employed and the thus detected audio or video signal is supplied to an output amplifier and subsequently utilized as appropriate. An automatic gain control circuit 25 responsive, for example, to the output of the IF amplifier 19 and itself having an output indicative of the average signal strength is used to control the gain of one or more of the amplifier stages again according to well known techniques. Yet another prior art feature illustrated in FIG. 1 is the automatic frequency control circuit 27 which itself may be a discriminator type circuit having an input of frequency migrations, and an output voltage the magnitude of which is indicative of those frequency changes. This automatic frequency control circuit is conventional receivers is of course used only to correct the frequency of the local oscillator 17 so that the intermediate frequency amplifiers are operating on signals centered about the specified intermediate frequency, however, in the present invention this automatic frequency control circuit controls both the radio frequency amplifier and the intermediate frequency oscillator. The inputs to both the automatic frequency control circuit and the automatic gain control circuit may of course be derived at various points within the receiver, all in accordance with well known prior art schemes. The novel portion of FIG. 1 resides in the search tune circuit 29 having inputs from both the automatic frequency control circuit 27 and the automatic gain control circuit 25 and supplying an output voltage to both the voltage tuned RF amplifier 13 and the voltage tuned local oscillator 17. The details of this search tune circuit 29 are shown in FIGS. 2 and 3.

Figure 2:
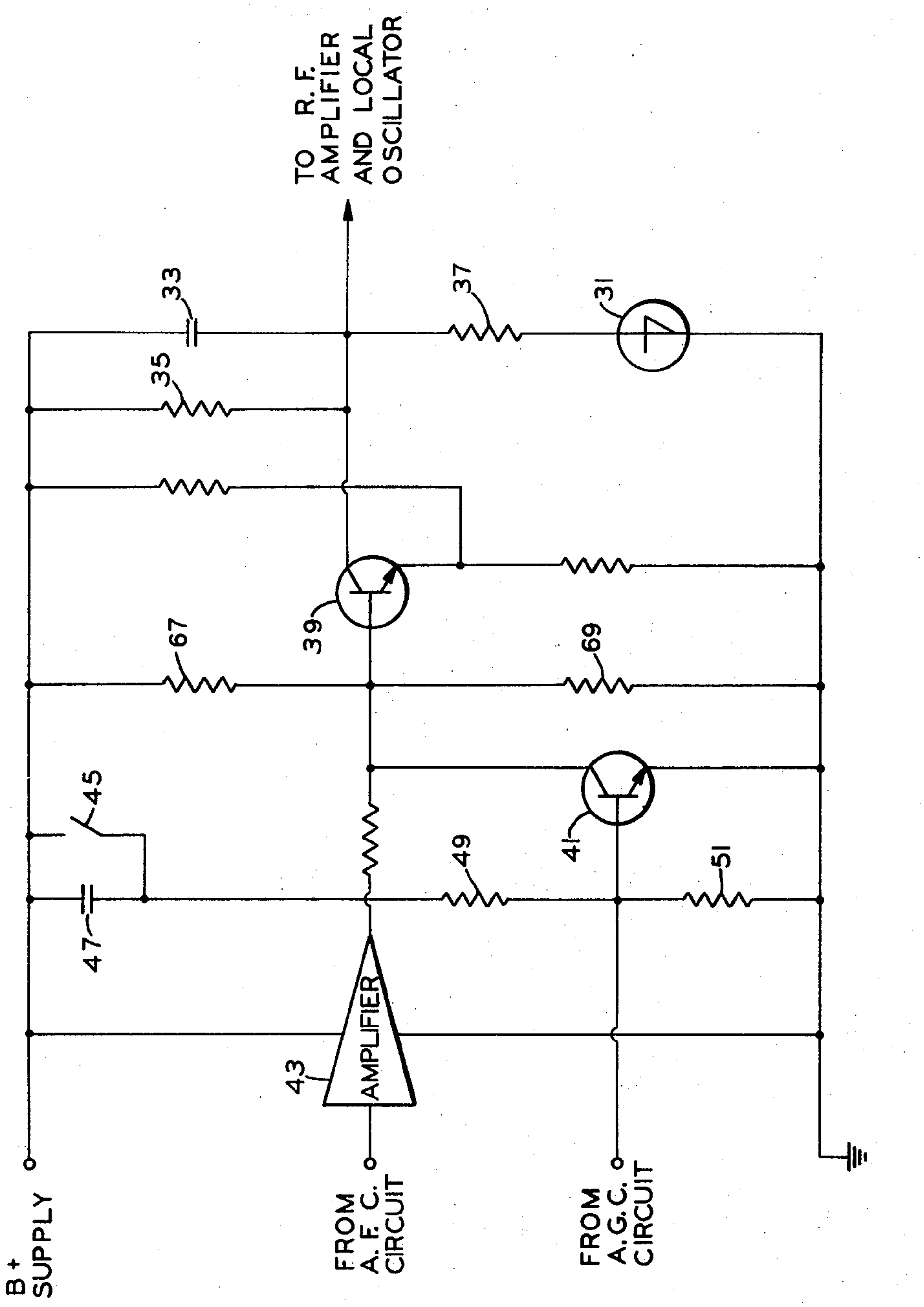
FIG. 2 is a schematic diagram of one embodiment of the search tuning circuit of FIG. 1.
Figure 3:
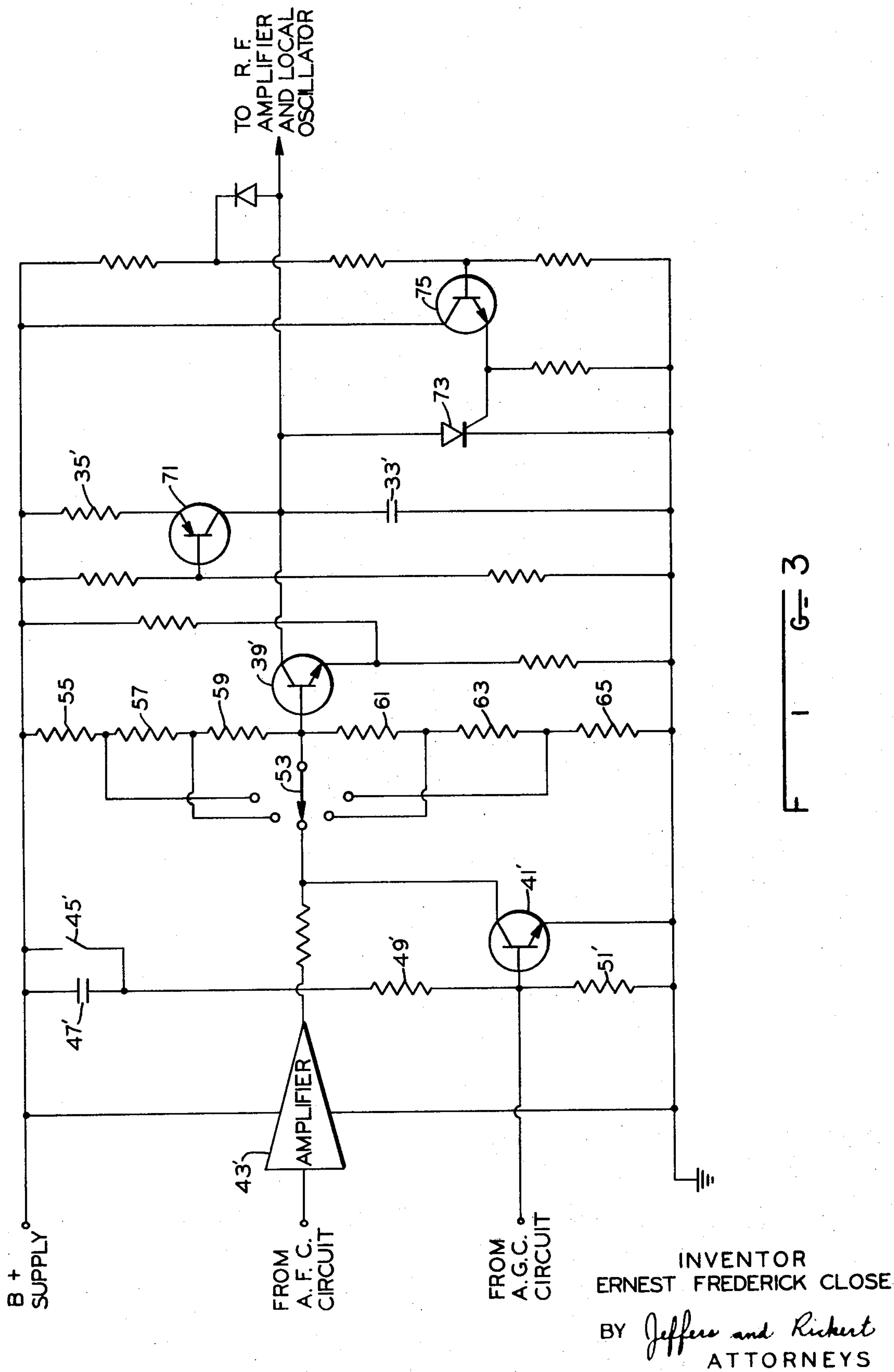
FIG. 3 is a schematic diagram of another possible embodiment of the search tuning circuit of FIG. 1 having provision for manual tuning.

Turning now to FIG. 2, a four-layered diode 31, a main storage capacitor 33, a discharging resistor 35, and a surge protection resistor 37 taken together constitute a relaxation oscillator which generates a sawtooth voltage for "scanning the dial". If allowed to continue, this relaxation oscillator would generate a sawtooth wave form which would search the band of incoming signals from one end to the other, snap back to the beginning and continue cycling through the band of incoming signals at a rate determined by the RC time constant of the circuit. This relaxation circuit will be allowed to continue so long as the transistor 39 is non-conducting. The transistor 39 is referred to as a holding transistor because its effect when energized is to stop the linearly changing search voltage and hold it as the value it had attained when stopped. While a Shockley or four-layered diode 31 has been shown in FIG. 2 as the backbone of the sawtooth wave form generator, it is clear that a silicon controlled rectifier, thyratron, neon bulb, or any of several other nonlinear devices might be used to generate the desired wave form output. Similarly, minor modifications could allow the capacitor 33 to lie between the output lead to the RF amplifier and local oscillator and ground rather than between this output lead and the positive direct current source. The essence of the relaxation circuit operation is that the four-layer diode 31 represents an extremely high impedance until its breakdown voltage is exceeded, at which time the four-layer diode conducts readily until the current passing through it diminishes sufficiently to allow it to switch back to its high impedance state. In the relaxation oscillator circuit shown the capacitor 33 is discharging through the resistor 35, while the output voltage is linearly increasing with time and then the capacitor 33 is very rapidly recharged when the four-layer diode 31 assumes its conducting state. Resistor 37 is present merely to limit this charging current to reasonable values.

As noted earlier, the holding transistor 39 is cut off during the band searching process. When the system is not tuned to a station of sufficient strength the automatic gain control circuitry 25 of FIG. 1 supplies a substantial positive voltage to both amplifier stages as well as the base of a gating transistor 41. Under these circumstances the transistor 41 switches to its "on" condition effectively shorting the output of the automatic frequency control amplifier 43 as well as grounding the base of the holding transistor 39 so that the holding transistor 39 is non-conductive. Suppose now that the system encounters an incoming signal of adequate magnitude so that the AGC circuit 25 now supplies a zero or negative voltage to the amplifier stages and to the base of the transistor 41. This will cause the gating transistor 41 to become non-conductive, under which circumstances the base of the transistor 39 becomes somewhat positive relative to its emitter and the holding transistor 39 becomes conductive. Under these circumstances the automatic frequency control circuit is supplying to the amplifier 43 a signal indicative of the frequency previously dictated by the point along the linear ramp of the sawtooth wave form attained when the station was encountered. In essence then, the transistor 39 is now supplying a voltage from the AFC circuit equivalent to the voltage previously supplied by the relaxation circuit which will serve to hold the receiver to the station it is tuned to.

Suppose that the system were tuned to a given incoming signal and then that station were to go off the air. Under these circumstances, the automatic gain control circuitry 25, in its normal fashion, would attempt to increase the gain of the two amplifier stages and thereby also supply a positive voltage to the gating transistor 41, turning this gating transistor on, and shorting the output of the automatic frequency control amplifier 43, and simultaneously cutting off the holding transistor 39. The relaxation oscillator would again begin to function starting its linear increase in voltage from that point where it had been held previously by conduction of the holding transistor 39. This linearly increasing voltage would be supplied to both the local oscillator 17 and the voltage tuned RF amplifier 13 until such time as another station is encountered. When that station is found the AGC signal becomes more negative than a predetermined threshold value and gating transistor 41 is again cut off. At this time the holding transistor 39 begins to conduct and stops the rise of the sawtooth voltage. The automatic frequency control voltage will automatically adjust the current in the holding transistor to counterbalance the discharge current from the capacitor 33 into the discharging resistor 35 so that the voltage on the capacitor 33 and therefore also the voltage output of the search tune circuit 29 is held at the necessary value to keep the station in tune.

The circuit as thus far described would be married to a given incoming signal once it had locked onto that signal, until such time as the signal disappeared and would, of course, be entirely unsuitable for its intended use. Some scheme must be provided for dislodging the search circuitry from a given station so that it may seek out a new station on command. A push button switch 45 and capacitor 47 provide one scheme for dislodging the search circuitry. During normal operation when receiving device is tuned to a station the transistor 41 is not conducting and the capacitor 47 is charged to substantially the B+ supply voltage. Momentary closure of the switch 45 will rapidly diminish the charge on the capacitor 47 so that a substantial portion of the B+ supply voltage which previously all appeared across the capacitor 47 is now transferred to the resistors 49 and 51 whose values are appropriately selected so that this change causes a change in the bias voltage on the base of the transistor 41, thus switching it to a conducting state. Since some time is required to recharge the capacitor 47 after the push button switch 45 has been released, the search tune circuit will begin its search tuning operation and advance sufficiently far from the station on which it was locked to prevent the automatic frequency control circuit from recapturing that first station.

From the user's point of view then, the search tune circuit of FIG. 2, when the receiver is first turned on, will always begin its searching operation at one end of the reception band and progress across the band until the first station of adequate magnitude is encountered. The circuitry will lock onto that station and remain there until the operator either turns the receiver off, or momentarily closes the push button switch 45. On closure of this switch 45 the circuit will begin searching in the same direction across the band from the point to which it had been previously locked until another incoming signal of adequate magnitude is encountered. This direction is sometimes referred to as the upward direction. When the receiver is turned off the capacitor 33 will discharge thus losing the station to which it had been tuned, and upon reenergization will begin its search process all over again from its starting point. It is clear that a user might desire to be able to tune in either direction in a quasi manual manner and this provision along with other modifications to the circuit of FIG. 2 is shown in FIG. 3.

Turning now to FIG. 3, it should be noted that this circuit is an alternative schematic for the search tune circuit 29 of FIG. 1 and thus shows the same inputs and outputs as illustrated in the schematic diagram of FIG. 2. Furthermore, numerous components from FIG. 2 are carried over into the schematic of FIG. 3 retaining precisely the same function and, accordingly, are marked with primed identical reference numerals and will be rediscussed only insofar as their function bears on the variations between FIGS. 2 and 3.

Two variations are immediately obvious in that a multiposition switch 53, and a more complex relaxation oscillator have been added. The switch 53 is spring loaded so as to always rest in its middle position, as illustrated, and must be hand held against the spring tension to effectuate contact with any of the other contacts. The resistors 55, 57, 59, 61, 63 and 65 collectively provide the appropriate bias for the holding transistor 39' and perform precisely the same function as resistors 67 and 69 of FIG. 2, when the switch is in the position illustrated. Suppose now that the circuit of FIG. 3 is locked to an adequate incoming signal, but that the user wishes to change stations. He may do this by momentarily pushing the push button 45 which, as discussed earlier, will cause the circuit to search in the upward direction until it encounters the next adequate incoming signal. The user might also move the switch 53 from its static position illustrated to the first encountered lower contact so as to decrease the potential of the base of the transistor 39'. This, of course, decreases the gain of the transistor thus increasing the charge on the capacitor 33'. An increase in the charge on the capacitor 33', of course, increases the output voltage supplied to the varicaps in the RF amplifier and local oscillator and hence by moving the switch 53 downwardly we have again caused the circuit to release the station it had locked onto and to seek a new adequate incoming signal. Moving the switch 53 onto its extreme downward position obviously further decreases the potential of the base of the transistor 39' causing a more rapid charging of the capacitor 33' with the resultant rapid rather than slow scan. Moving the switch 53 to one of its two upper positions results in scanning the band of incoming signals in reverse direction as will appear more clearly subsequently. As long as switch 53 is held off of its center position, locking is disabled and the effect is the same as manually tuning a conventional receiver.

Before discussing the reverse or downward direction search provision provided by the switch 53, when in one of its upper positions, some attention should be directed to the differences in the relaxation oscillators illustrated in FIGS. 2 and 3. An additional transistor 71 has been provided as a charging current source for the capacitor 33' and the four-layer diode 31 of FIG. 2 has been supplanted by a silicon controlled rectifier 73. The linearly increasing portion of the sawtooth voltage is provided during the charging of the capacitor 33' while this same linearly increasing portion was provided by the discharging of the capacitor 33 in FIG. 2. In FIG. 2 the rapid fall off of the sawtooth voltage was provided by rapidly charging capacitor 33 while the four-layer diode 31 was conducting, whereas this rapid fall off is provided in FIG. 3 by discharging the capacitor 33' through the silicon controlled rectifier 73. There is, of course, a clear interchangeability of these features between the two circuits. The relaxation oscillator of FIG. 3 has yet another extra transistor 75 which functions to trigger the silicon controlled rectifier 73 when the linearly increasing output voltage reaches its predetermined maximum. The transistor 71 and its associated resistor 35', of course, replace the charging resistor 35 of FIG. 2.

If the switch 53 is moved upward, the bias on the base of the transistor 39 is increased so that the transistor becomes more conductive. This allows more of the current from the source 71 to be drained through transistor 39' as well as some of the charge on capacitor 33', thus causing a slowly decreasing output voltage to be generated. Further raising of the switch 53 causes the same decreasing output voltage but at a much more rapid rate. In its upper positions, the switch 53 increases the biasing of the base of the transistor 39 causing a greater conduction through the transistor thus discharging the capacitor 33 and creating a slowly diminishing output or search voltage. If the switch 53 were in one of its upper positions and then released with the receiver in the neighborhood of an adequate incoming signal, the AFC circuitry will take over and lock the receiver to that signal. However, if the receiver is not in the capture range of an adequate incoming signal, the direction of search will reverse and the system will search backward through recently passed stations until an adequate signal is encountered. More sophisticated circuitry could be provided in order that the system continues searching in the direction imparted to it by movement of the switch 53.

A multitude of other possible variations on the invention disclosed should now readily present themselves to those of ordinary skill in the art. Thus, for example, a meter type dial 30 may be provided which is responsive to the voltage on the output of the search tune circuit and this meter could be directly calibrated in kilocycles, megacycles, or appropriate channel numbers, depending upon the type of receiver involved so as to directly read an indication of the station to which the receiver is tuned. Similarly an appropriate potentiometer circuit could be included to provide a true manual tuning of the receiver. Signals other than an automatic gain control signal might be employed to indicate the presence of a suitable incoming signal. Thus, for example, the presence of synchronizing pulses in a TV receiver might be employed. It should be clear that the system as disclosed will lose any station to which it was tuned when the receiver is shut off and reenergized. This drawback might be overcome by an appropriate mechanical device which "remembered" the search tune circuit output voltage at the time the receiver was shut off. Similarly, a magnetic core memory system might be provided to retain a measure of this output voltage. These and other modifications will readily suggest themselves to those of ordinary skill in the art and, accordingly, the scope of the present invention should be measured only by that of the appended claims.

I claim:

1. In a heterodyne receiving device having a voltage tuned radio frequency amplifier, a voltage tuned local oscillator, a first control circuit having an output which varies as a function of the magnitude of a received signal, and a second control circuit having an output which varies as a function of the frequency of an intermediate frequency signal within the receiver, an improved electronic search tuning system comprising:

a first voltage source having an output which varies as a substantially linear function of time;

means for selectively supplying the output of one of said first voltage source and said second control circuit to each of said radio frequency amplifier and said local oscillator; and means responsive to said first control circuit for controlling said selectively supplying means to supply the output of said first voltage source while the receiver is seeking an incoming signal and to supply the output of said second control circuit upon receipt of a sufficiently strong incoming signal.

2. The improvement of claim 1 wherein said first control circuit also functions as an automatic gain control circuit.

3. The improvement of claim 1 wherein said second control circuit also functions as an automatic frequency control circuit.

4. The improvement of claim 1 wherein said selectively supplying means comprises:

a first transistor responsive to said first control circuit and adapted to be in a conducting state when said first control circuit indicates no sufficiently strong incoming signal to be present and in a nonconducting state when said first control circuit indicates the presence of an adequate incoming signal; and a second transistor responsive to the state of said first transistor.

5. The improvement of claim 4 wherein said second transistor is in a conducting state when said first transistor is in a nonconducting state and said second transistor is in a nonconducting state when said first transistor is in a conducting state.

6. The improvement of claim 4 further comprising a manually actuable means for switching said first transistor from its nonconducting to a conducting state in spite of the presence of an adequate incoming signal.

7. The improvement of claim 6 where said manually actuable means comprises a push button switch and a capacitor, said push button switch adapted to substantially alter the charge on said capacitor, said capacitor forming a portion of the biasing circuitry for said first transistor.

8. The improvement of claim 1 wherein said first voltage source comprises:

a capacitance and a resistance connected in series across a direct current source, and means for rapidly changing the charge on said capacitance when the voltage thereon exceeds a predetermined value.

9. The improvement of claim 1 further comprising manually actuable deceiving means for temporarily substituting a different signal for the output of said second control circuit to effect manual tuning of the receiving device.

10. The improvement of claim 9 wherein said deceiving means superimposes a direct current bias on the output of said second control circuit.

11. A search tune circuit for a heterodyne receiving device having as inputs an automatic frequency control signal and an automatic gain control signal, and providing an output to at least one voltage variable capacitor diode comprising:

a first transistor responsive to said automatic gain control signal and adapted to conduct when said automatic gain control signal indicates the receiver is not tuned to an adequate incoming signal and adapted to be nonconductive when said automatic gain control signal indicates the receiver is receiving an adequate incoming signal;

means for amplifying said incoming automatic frequency control signal;

a second transistor which is conductive when said first transistor is nonconductive and which is nonconductive when said first transistor is conducting;

said second transistor adapted to provide when conducting a constant voltage output indicative of said incoming automatic frequency control signal;

relaxation oscillator means adapted to provide a repeating substantially linearly changing with time output voltage when said second transistor is nonconductive;

said second transistor effective upon changing from nonconduction to conduction to substitute for said linearly changing output voltage said automatic frequency control signal.

12. The circuit of claim 11 further comprising a capacitor and a switch shunting the capacitor adapted to provide a bias voltage for said first transistor whereby said first transistor may be switched from its nonconducting to its conducting state upon actuation of said switch.

13. The circuit of claim 11 further comprising manually actuable means for varying the bias on said second transistor whereby a false automatic frequency control signal is passed by said second transistor causing said end receiver to seek a new adequate incoming signal.

* * * * *